(12) United States Patent
Takagi (10) Patent No.: US 9,013,034 B2
(45) Date of Patent: Apr. 21, 2015

(54) SEMICONDUCTOR PACKAGE (71) Applicant: Kabushiki Kaisha Toshiba, Minato-ku (JP)

(72) Inventor: Kazutaka Takagi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/202,075

(22) Filed: Mar. 10, 2014

(65) Prior Publication Data
US 2014/0306334 A1    Oct. 16, 2014

(30) Foreign Application Priority Data

Apr. 15, 2013   (JP) ................................. 2013-085233

(51) Int. Cl.
*H01L 23/06*     (2006.01)
*H01L 23/48*     (2006.01)
*H01L 23/043*    (2006.01)
*H01L 23/047*    (2006.01)

(52) U.S. Cl.
CPC ..... *H01L 23/043* (2013.01); *H01L 2224/32245* (2013.01); *H01L 2224/48091* (2013.01); *H01L 2224/48227* (2013.01); *H01L 2224/73265* (2013.01); *H01L 23/047* (2013.01)

(58) Field of Classification Search
CPC .................................................. H01L 23/498
USPC ................... 257/783, 701, 703, 704, E23.183
See application file for complete search history.

(56) References Cited

U.S. PATENT DOCUMENTS

| | | | | |
|---|---|---|---|---|
| 4,608,592 A | * | 8/1986 | Miyamoto | 257/700 |
| 4,649,416 A | * | 3/1987 | Borkowski et al. | 257/728 |
| 4,831,212 A | * | 5/1989 | Ogata et al. | 174/546 |
| 5,041,695 A | * | 8/1991 | Olenick et al. | 174/540 |
| 5,814,880 A | * | 9/1998 | Costello et al. | 257/678 |
| 5,814,883 A | * | 9/1998 | Sawai et al. | 257/712 |
| 6,301,122 B1 | * | 10/2001 | Ishikawa et al. | 361/794 |
| 8,749,046 B2 | * | 6/2014 | Kodani | 257/690 |

(Continued)

FOREIGN PATENT DOCUMENTS

| | | |
|---|---|---|
| JP | 2005-32834 | 2/2005 |
| JP | 2006-13241 | 1/2006 |

(Continued)

OTHER PUBLICATIONS

U.S. Appl. No. 13/871,149, filed Apr. 26, 2013, Takagi.

(Continued)

*Primary Examiner* — Nitin Parekh
(74) *Attorney, Agent, or Firm* — Oblon, McClelland, Maier & Neustadt, L.L.P.

(57) ABSTRACT

A semiconductor package, wherein, in bonding of members constituting the semiconductor package, by using bonding layers containing copper and a low-melting-point metal such as tin, the bonding is performed in a temperature range where the occurrence of warpage or distortion of the members is suppressed, and after the bonding, a high melting point is obtained; and by configuring the members so that all the surfaces of the members which become bonding surfaces of bonding layers are parallel to each other, all the thickness directions of the bonding layers are aligned to be in the same direction, and during the formation of the bonding layers, the pressing direction is set to be one-way direction which is the direction of laminating the members.

16 Claims, 5 Drawing Sheets

(56) References Cited

U.S. PATENT DOCUMENTS

| | | | |
|---|---|---|---|
| 2010/0200932 A1* | 8/2010 | Ueda | 257/401 |
| 2012/0126246 A1 | 5/2012 | Takagi | |
| 2013/0105205 A1 | 5/2013 | Takagi | |
| 2014/0063757 A1 | 3/2014 | Takagi et al. | |

FOREIGN PATENT DOCUMENTS

| | | |
|---|---|---|
| JP | 2012-124477 A | 6/2012 |
| JP | 2012-209334 | 10/2012 |
| JP | 2013-77741 | 4/2013 |
| JP | 2013-187303 A | 9/2013 |
| JP | 2013-187418 A | 9/2013 |
| JP | 2013-229474 A | 11/2013 |
| JP | 2014-049700 A | 3/2014 |
| JP | 2014-053384 A | 3/2014 |

OTHER PUBLICATIONS

U.S. Appl. No. 14/200,284, filed Mar. 7, 2014, Takagi.

* cited by examiner

SEMICONDUCTOR PACKAGE

CROSS-REFERENCE TO RELATED APPLICATIONS

This application is based upon and claims the benefit of priority from the prior Japanese Patent Application No. 2013-085233, filed on Apr. 15, 2013, the entire contents of which are incorporated herein by reference.

FIELD

Embodiments described herein relate generally to a semiconductor package containing semiconductor devices.

BACKGROUND

In many cases, semiconductor devices including semiconductor elements, peripheral circuits, are used in the form of, for example, a semiconductor package containing and hermetically sealing the semiconductor devices by taking into consideration mounting, heat dissipation, and the like. When the semiconductor devices are to be contained in the semiconductor package, the semiconductor devices are fixed on a substrate of the semiconductor package through bonding or the like.

Therefore, in this type of the semiconductor package, in terms of the bonding temperature of the semiconductor device or the operating temperature of the semiconductor device, the structure needs to be sufficiently stabilized, and thus, when the semiconductor package is to be assembled, members are bonded to each other by using silver solder or the like having a high melting point (for example, 780° C. or higher). Namely, the members are bonded to each other at a temperature which is much higher than the bonding temperature of the semiconductor device or the operating temperature of the semiconductor device.

However, in the case of using silver solder or the like, since the assembling is performed at a high temperature, warpage or distortion may occur due to a difference in coefficients of thermal expansion among the members made of different materials, and thus, a function as a semiconductor package may be deteriorated.

DETAILED DESCRIPTION

Therefore, the inventors of the present application proposed a technique for solving the problem in Japanese Patent Application Number 2011-235385 (U.S. application Ser. No. 13/558,765; the entire contents of which are incorporated herein by reference). The technique disclosed in JP 2011-235385 has excellent points in that members in a semiconductor package can be bonded to each other through a bonding process at a temperature (for example, about 250° C. to 300° C.) lower than the temperature of sliver soldering, and moreover, after the bonding, a bonding layer having a melting point (for example, about 750° C.) comparable with that of silver soldering can be formed.

During the bonding process, it is necessary to press the members interposing bonding layers so as to form a stabilized bonding layer. When the package has different directions of the bonding surface plane, the different directions of pressing is necessary. However, it is difficult to press the members in a plurality of different directions, and it makes the bonding process complicated. Therefore, it is necessary to form all the bonding layers to bond the members by pressing the members in the same direction (in one direction). In addition, at this time, all the thickness directions of the bonding layers are formed to be the same direction (pressing direction).

In this manner, a semiconductor package is preferred to have a form and structure where all the bonding layers are formed by pressing members in one direction when the members of the semiconductor package are bonded to each other.

In view of the above circumstances, the embodiment of the present invention is to provide a semiconductor package having small warpage or distortion and maintaining good hermeticity by forming a stabilized bonding layer without complicating manufacturing processes.

According to an aspect of the embodiment, there is provided a semiconductor package including: a flat substrate having a fixation area where a semiconductor device is fixed on an upper surface; a ceramic frame body having a planar shape including upper-layer and lower-layer ceramic frames, a printed wiring which becomes a terminal being formed on an upper surface of the lower-layer ceramic frame, portions of the upper-layer ceramic frame where there are the both ends of printed wiring being narrower than the lower-layer ceramic frame in width so that the two ends of the printed wiring are exposed to sidewalls to be used as terminals, the ceramic frame body surrounds the fixation area and is laminated on an upper surface of the substrate, and the bottom surface of the ceramic frame body being bonded to the upper surface of the substrate through a first bonding layer; a metal ring which has a shape corresponding to a shape of the frame in the upper surface of the ceramic frame body and which is laminated on the upper surface of the ceramic frame body to be bonded to the ceramic frame body through a second bonding layer; and a lead which is laminated on the printed wiring to be bonded to the printed wiring through a third bonding layer, wherein each of the first bonding layer, the second bonding layer, and the third bonding layer contains copper (Cu) and at least one metal among tin (Sn), indium (In), and zinc (Zn) as a composition and has a region where the metal content is decreased in a direction toward the one of two opposite bonding surfaces which are two ends of the bonding layer in the thickness direction, and copper content is increased in the same direction.

Hereinafter, the semiconductor package according to the embodiment will be described with reference to FIGS. 1 to 5.

Figure 1:
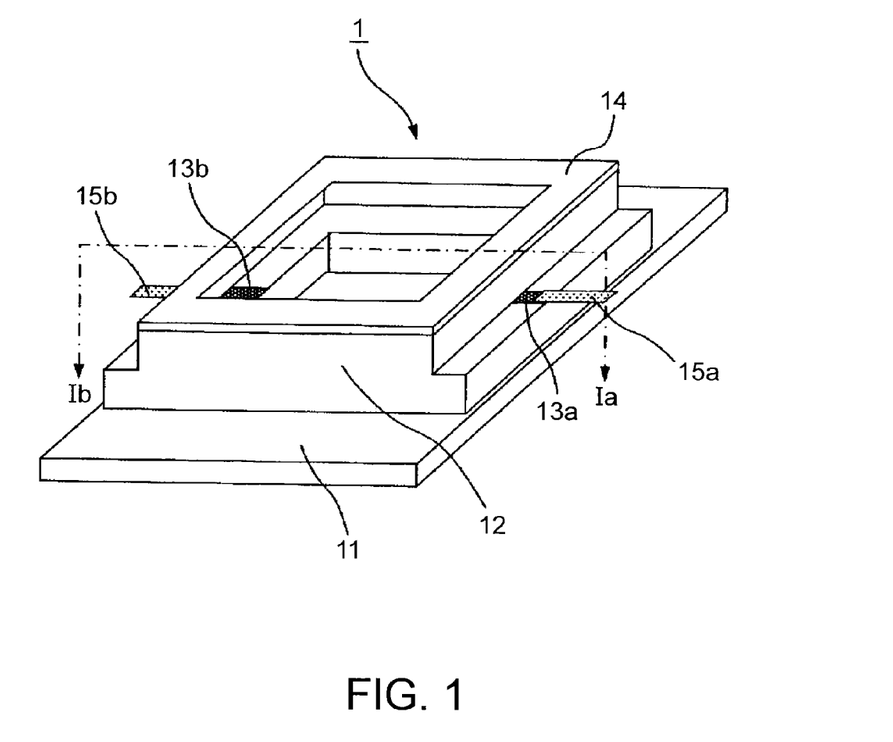
FIG. 1 is a perspective view illustrating an outer appearance of a semiconductor package according to an embodiment of the present invention.
Figure 2:
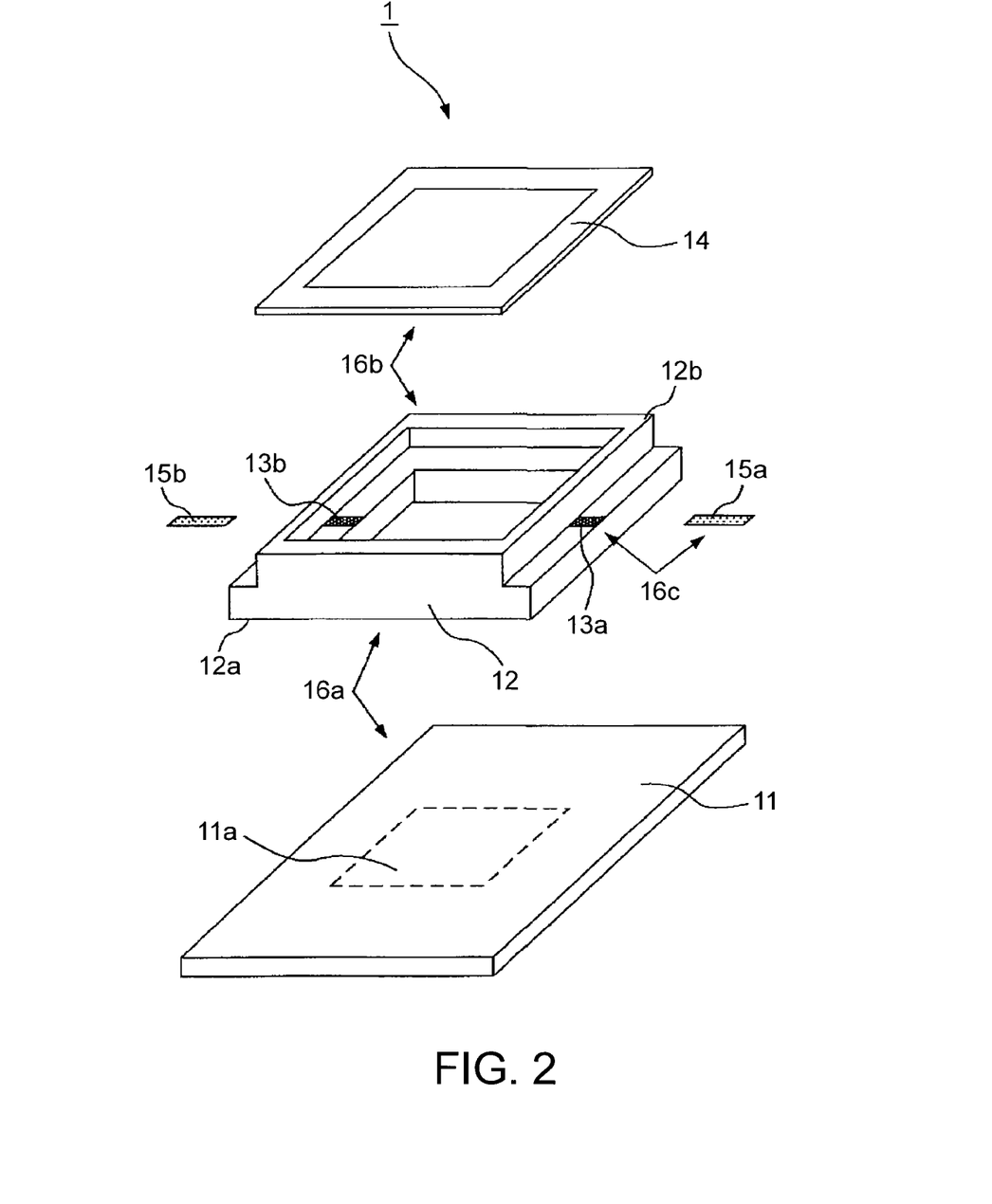
FIG. 2 is an exploded perspective view illustrating the semiconductor package illustrated in FIG. 1.
Figure 3:
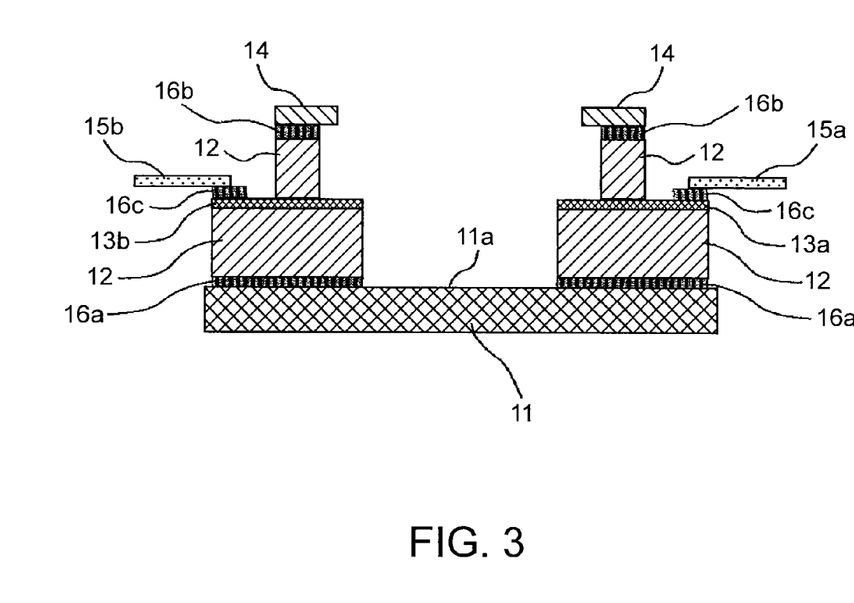
FIG. 3 is a cross-sectional view illustrating a model of a cross section of the semiconductor package taken along line Ia-Ib of FIG. 1.

FIG. 1 is a perspective view illustrating an outer appearance of the semiconductor package according to the embodiment, and FIG. 2 is an exploded perspective view thereof. In addition, FIG. 3 is a cross-sectional view illustrating a model of a cross section taken along line Ia-Ib of FIG. 1. As illustrated in the figures, the semiconductor package 1 is configured to include a substrate 11, a ceramic frame body 12 where printed wirings 13 are formed, a metal ring 14, and leads 15 which are bonded to the printed wirings 13.

The substrate 11 and the ceramic frame body 12 are bonded to each other by a bonding layer 16a (first bonding layer); the ceramic frame body 12 and the metal ring 14 are bonded to each other by a bonding layer 16b (second bonding layer); and the printed wirings 13 and the leads 15 are bonded to each other by a bonding layer 16c (third bonding layer), so that these are integrated as a semiconductor package. In addition, the bonding layers 16 (16a, 16b, and 16c) are formed so that thickness directions thereof are the same direction. In the embodiment, as illustrated in FIG. 3, all the thickness directions of the bonding layers are formed to be the up/down direction of the paper, that is, the direction in which members are laminated.

The substrate 11 is formed in a shape of a flat plate made of, for example, copper (Cu) or a compound of copper (Cu) and molybdenum (Mo), laminate of copper and molybdenum (Mo), and the like, and the upper surface thereof includes a fixation area 11a where the semiconductor device and the like are fixed. The ceramic frame body 12 has a shape of a quadrangular frame surrounding the fixation area 11a, and a bottom surface 12a and an upper surface 12b are parallel to each other. In addition, the ceramic frame body 12 is laminated on the substrate 11 so as to surround the fixation area 11a and is bonded to the substrate 11 through the bonding layer 16a by using a contact surface between the bottom surface 12a and the substrate 11 as a bonding surface.

In addition, two printed wirings 13 (13a and 13b) are formed on sidewalls of the ceramic frame body 12 to penetrate the frame body. The printed wirings 13 are formed on the surface parallel to the bottom surface 12a and the upper surface 12b which are parallel opening planes and are formed so that the front surfaces thereof at the upper surface 12b side are exposed. In the embodiment, the opposite sidewalls of the ceramic frame body 12 are formed in a shape of a stairs, and the printed wirings 13 on the stairs surfaces are exposed.

Figure 4:
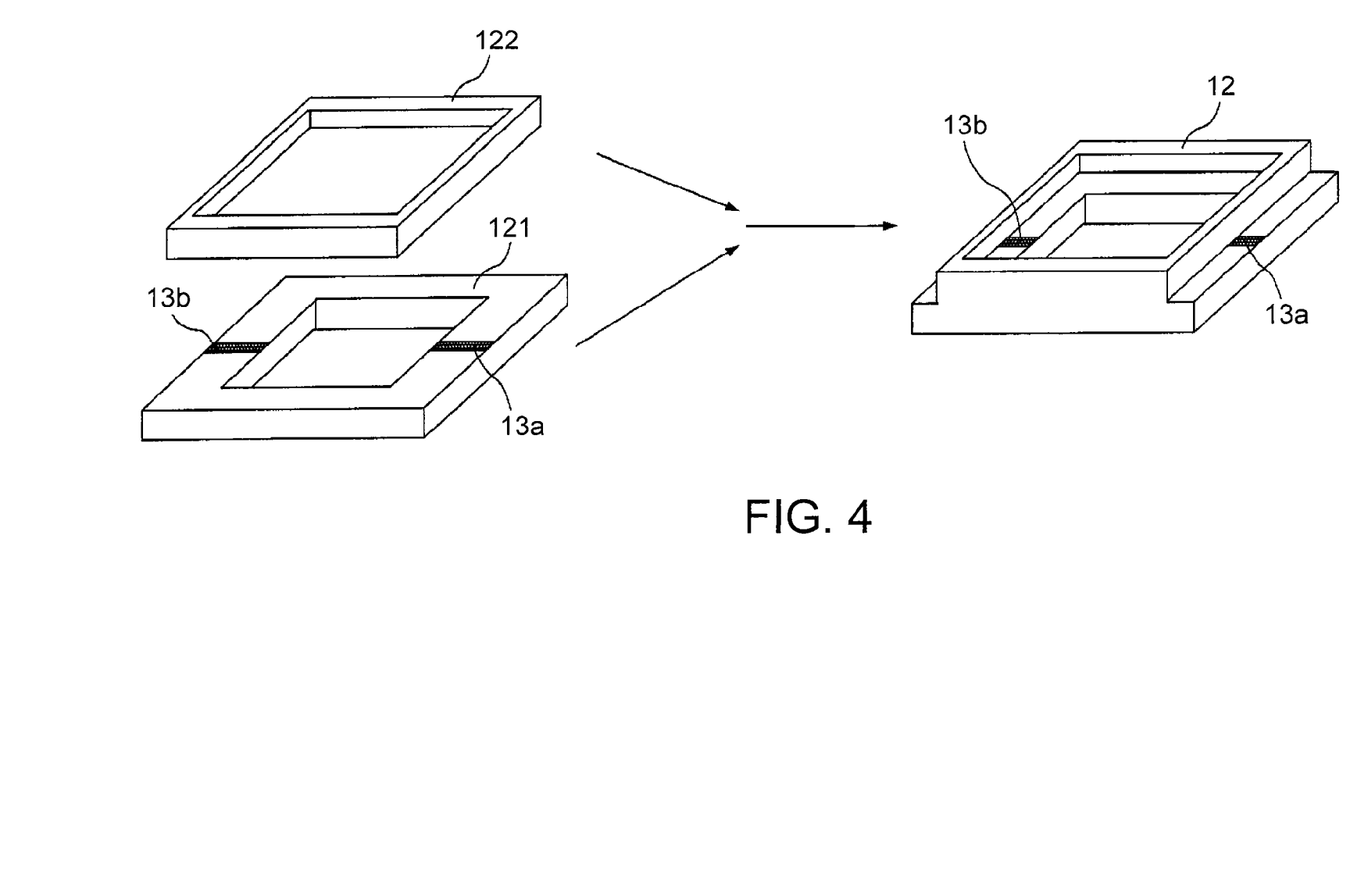
FIG. 4 is an exploded perspective view illustrating an example of a structure of a ceramic frame of the semiconductor package illustrated in FIG. 1.

An example of a method of forming the ceramic frame body 12 having the shape is illustrated in FIG. 4. In the example illustrated in FIG. 4, first, a lower frame 121 and an upper frame 122 are formed as the two lower and upper frames having parallel opening planes by using a ceramic material. The lower frame 121 is formed in a wide shape so that the upper surface of the lower frame 121 is exposed as a stairs surface when the two frames overlap each other. After the two printed wirings 13a and 13b are formed between inner and outer edges on the upper surface of the lower frame 121, the upper frame 122 overlaps the lower frame 121, and the resulting product is integrated through baking, so that the ceramic frame body 12 according to the embodiment can be obtained.

The metal ring 14 has a shape corresponding to the shape of the frame of the upper surface 12b side of the ceramic frame body 12 and is formed by using, for example, a Kovar material or the like as an alloy formed by mixing nickel (Ni) and cobalt (Co) with iron (Fe). The metal ring 14 is laminated on the upper surface 12b of the ceramic frame body 12 and is bonded to the ceramic frame body 12 through the bonding layer 16b. Since the metal ring 14 absorbs unevenness or waviness of the surface of the upper surface 12b of the ceramic frame body 12, for example, when laminating a cap (not illustrated) or the like and performing sealing after allowing the semiconductor device and the like to be accommodated in the semiconductor package 1, the metal ring 14 maintains good hermeticity of the cap and the like.

The two leads 15 (15a and 15b) are bonded to the surfaces of the portions of the two printed wirings 13a and 13b, which are exposed outside from the ceramic frame body 12, through the bonding layer 16c. The leads 15 are formed as terminals for connecting signals to the semiconductor device and the like contained in the semiconductor package 1 through the printed wirings 13 by using, for example, copper or a Kovar material.

All the three bonding layers 16 (16a, 16b, and 16c) include copper and tin as a low-melting-point metal, and in terms of composition, tin content is decreased and copper content is increased in a direction toward one of the two opposite bonding surfaces which are both ends of each bonding layer in the thickness direction. In the embodiment, the bonding layers 16 having the composition are formed through liquid phase diffusion of, for example, copper and tin.

Since the liquid phase diffusion of copper and tin occurs in a temperature range of 250° C. to 300° C., the bonding layers can be formed at a temperature lower than the temperature (for example, 780° C. or higher) of the case of silver solder bonding. For this reason, when the members are integrated as a package, the occurrence of warpage or distortion can be suppressed. Moreover, since the melting point of the compound formed through the liquid phase diffusion of copper and tin is, for example, about 750° C. and is comparable with that of the bonding by silver soldering, the structure is stabilized in terms of the bonding temperature or operating temperature of the semiconductor device.

In the formation of each bonding layer 16, for example, first, a copper layer is formed on the one of the bonding surfaces of the two members or the like as bonding objects through sputtering or the like; and a copper layer and a tin layer are formed in this order on the other of the bonding surfaces through sputtering or the like in the same manner. After that, the bonding surfaces are in contact with each other so as to laminate each other, and the resulting product is pressed and heated in a required temperature range (for example, 250° C. to 300° C.). If this state is maintained, the tin which is a low-melting-point metal gradually diffuses into the copper layer in the thickness direction of the layer. Further, desired bonding layers are formed by maintaining the state for a predetermined time.

In the bonding layers 16 formed in this manner, tin content is gradually decreased and, on the contrary, copper content is increased by the amount of decrease in the tin content in the thickness direction of the bonding layers corresponding to the direction in which tin diffuses. In addition, as described above, the bonding layer may be formed by laminating copper layers on two sides of a tin layer so as to interpose the tin layer between the two copper layers, and in this case, since tin as a low-melting-point metal diffuses into the copper layers of the two sides, the tin content is changed in an inverted V-shaped manner in the thickness direction of the bonding layer.

In addition, in the case where tin as a low-melting-point metal does not diffuse up to the end surface of the bonding layer, or in the case where a member itself having the bonding surface is formed by using copper so as to serve as a copper layer as a bonding layer, the bonding surfaces which are two end surfaces of the bonding layer after the bonding are formed as copper layers. Further, in order to prevent oxidation of the bonding surfaces, in the case where metal layers as protective layers are formed on the bonding surfaces of the members as bonding objects by using, for example, gold (Au) or platinum (Pt) and, after that, the above-described bonding layers 16 are formed, the bonding layers 16 also contain these metals. In addition, the bonding layers may be formed through liquid phase diffusion in the same manner by using indium (In) or zinc (Zn) as a low-melting-point metal besides the above-described tin.

For example, as disclosed in Japanese Patent Application Number 2011-235385, in the case of using tin, if the temperature of the metal bonding layer is set to 250° C. which is higher than the melting point of tin, that is, 232° C., tin becomes in a liquid phase state, and tin diffuses into solid-phase copper. At the same time, copper also diffuses into the tin side. As a result, a solid solution layer containing an α solid solution having about 15 wt % or less of tin is formed by copper and tin. Namely, the metal bonding layer contains an α solid solution of copper and tin.

For example, if a solid solution has a composition of 90 wt % of copper and 10 wt % of tin, it is possible to obtain a high bonding strength in a temperature range of about 330° C. to 820° C. without occurrence of phase change. In addition, since the solid solution formed in the above-described temperature range does not contain an intermetallic compound (η layer) of $Cu_6Sn_5$ or an intermetallic compound (ε layer) of $Cu_3Sn$, bonding having resistance to impact or the like is formed.

The diffusion temperature of the low-melting-point metal is not limited to the above-described range of 250° C. to 300° C., but it is different according to the type of the low-melting-point metal. For example, in the case of diffusing indium, the diffusion can be performed in a lower temperature range; and in the case of diffusing zinc, the diffusion can be performed in a higher temperature range.

In the case where a low-melting-point metal is formed on the one of two bonding objects and copper is formed on the other, if the two bonding objects are bonded, the low-melting-point metal diffuses into the copper side, so that it is possible to form the bonding where the concentration of the low-melting-point metal is decreased in the diffusion direction. In addition, in the case where copper is formed on both of two bonding objects and a low-melting-point metal is further formed on the one of the two bonding objects, if the two bonding objects are bonded, it is possible to form the bonding where the low-melting-point metal diffuses into the two copper sides. In addition, in the case where copper is formed on the one of two bonding objects and a low-melting-point metal is further formed on the one of the two bonding objects copper is formed thereon and the other of the two bonding objects itself is formed by copper, it is possible to form the bonding where the low-melting-point metal diffuses into the two copper sides. In addition, in the aforementioned cases, after gold, platinum, or the like is interposed, if the bonding is performed, during the melting of the low-melting-point metal, gold or silver is incorporated in liquid phase. In addition, during the formation of the bonding, it is also possible all the low-melting-point metals are allowed to diffuse into the metal bonding layer, in order that the solid phase of the original low-melting-point metals does not remain.

In the semiconductor package 1 having the above-described configuration, the members including the substrate 11, the ceramic frame body 12 where the printed wirings 13 are formed, the metal ring 14, and the leads 15 are bonded to the bonding layers 16 having the above-described composition to be integrated as the semiconductor package 1. In order to bond the members, necessary treatments such as sputtering are performed on portions which become the bonding surfaces of the members as bonding objects, the members are sequentially laminated, and pressing and heating are performed to form the bonding layers.

Herein, in a related art, a semiconductor package or the like may have a configuration where a feedthrough portion having, for example, a quadrangular outer shape for connecting signals is formed on a substrate, and a notch having a shape corresponding to the outer shape of the feedthrough portion is formed at a sidewall of a frame to penetrate the package. In this case, the bonding surfaces for bonding the sidewalls of the frame on the substrate to the quadrangular feedthrough portion exist on four peripheral surfaces facing to frame (upper, lower, and two side surfaces) of the feedthrough portion. Therefore, since the thickness directions of the bonding layers for bonding the upper and lower surfaces and the bonding layers for the two side surfaces are perpendicular to each other, in order to form bonding layers, pressing from different directions is required.

On the contrary, in the embodiment, when the members are laminated so as to be integrated as a semiconductor package, since the members are configured so that the corresponding surfaces of the members which become the bonding surface of the three bonding layers 16 are parallel to each other, all the thickness directions of the three bonding layers 16 (16a, 16b, and 16c) become the same direction, and thus, there is no bonding layer having different thickness direction. For this reason, the pressing direction for forming the bonding layers 16 may be the direction of laminating the members, that is, the one-way direction corresponding to the direction from the top of the paper to the bottom of the paper in the cross-sectional view of FIG. 3. Therefore, the three bonding layers 16 for bonding the members are able to be formed by pressing in the same direction (the direction for laminating the members).

In addition, since each bonding layer can be formed in a temperature range of, for example, about 250° C. to 300° C., warpage, distortion, or the like does not easily occur in each member and the semiconductor package; and since the bonding layers are formed to have a melting point of, for example, about 750° C., the structure is sufficiently stabilized in terms of the temperature of fixing the semiconductor device or the like inside the semiconductor package and the operating temperature of the semiconductor device or the like.

As described above, in the embodiment, when the members are to be bonded to each other to be integrated as a semiconductor package, the members are bonded to each other by using the bonding layers containing copper and a low-melting-point metal such as tin. Although the heating and pressing are needed during formation of the bonding layers, since the heating temperature can be set to be in a range of, for example, about 250° C. to 300° C., it is possible to reduce the occurrence of the warpage, distortion, or the like in the members and the semiconductor package. In addition, with respect to the pressing direction, since the bonding surfaces of the members are configured so that all the thickness directions of the bonding layers become the same direction, it is possible to form any one of the bonding layers by pressing in the direction of laminating the members, and it is possible to bond the members through the stabilized bonding layers without complicating the manufacturing process. Furthermore, since the bonding layers have a high melting point of, for example, about 750° C., the stabilized structure can be maintained in terms of the heating temperature of fixing the semiconductor device or the like inside the package and the increase in temperature due to the heat released from the semiconductor device or the like during the operation.

Therefore, it is possible to obtain a semiconductor package having small warpage or distortion and having good hermeticity by forming stabilized bonding layers between members without complicating manufacturing process.

Figure 5:
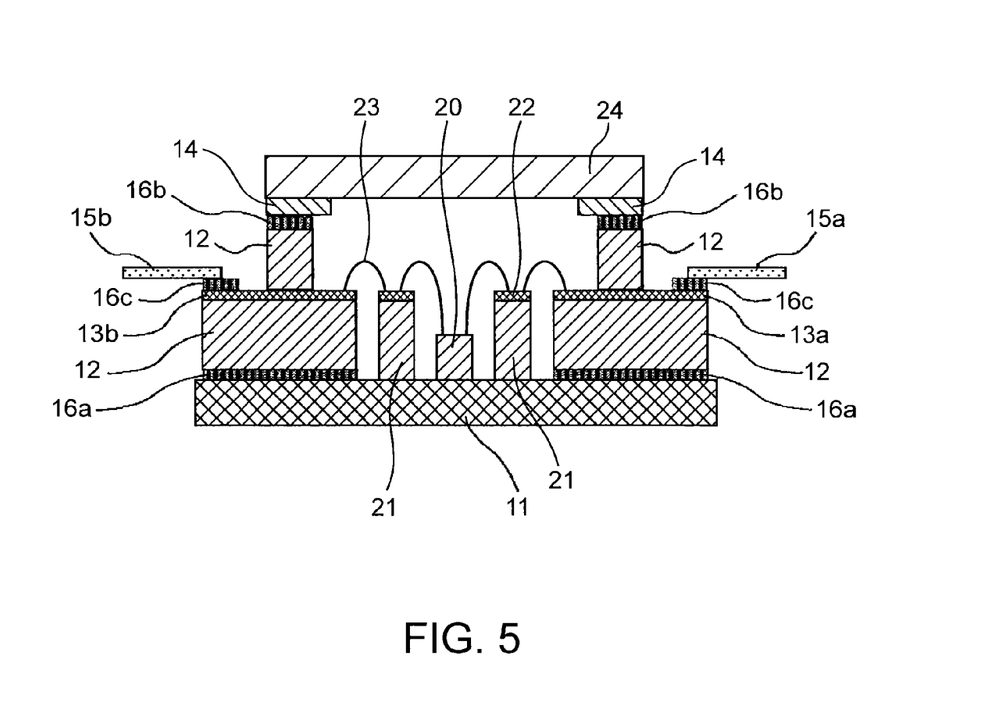
FIG. 5 is a schematic diagram illustrating an example of semiconductor device packaging according to the embodiment illustrated in FIG. 1.

FIG. 5 is a schematic diagram illustrating an example of semiconductor device packaging according to the embodiment. An electronic device 20 (semiconductor device) and a circuit board 21 are mounted on a device mounting portion (fixation area) of the semiconductor package. Conduction patterns 22 are formed on a surface of the circuit board 21 to electrically connect electrodes of the electronic device 20 with the printed wirings 13 (13a and 13b) through wire lines 23. In addition, a cover 24 is fixed on the frame body 12.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor package comprising:
   a flat substrate having a fixation area where a semiconductor device is fixed on an upper surface;
   a ceramic frame body having a planar shape including upper-layer and lower-layer ceramic frames, a printed wiring being formed on an upper surface of the lower-layer ceramic frame, portions of the upper-layer ceramic frame corresponding to two ends of the printed wiring being narrower than the lower-layer ceramic frame in width so that the both ends of the printed wiring are exposed to be used as terminals, the ceramic frame body surrounding the fixation area and being laminated on an upper surface of the substrate, and a bottom surface of the ceramic frame body being bonded to the upper surface of the substrate through a first bonding layer;
   a metal ring which has a shape corresponding to a shape of the frame in an upper surface of the ceramic frame body and which is laminated on the upper surface of the ceramic frame body being bonded to the ceramic frame body through a second bonding layer; and
   a lead which is laminated on the printed wiring being bonded to the printed wiring through a third bonding layer,
   wherein each of the first bonding layer, the second bonding layer, and the third bonding layer contains copper (Cu) and at least one metal among tin (Sn), indium (In), and zinc (Zn) as a composition and has a region where the metal content is decreased in a direction from one of the two opposite bonding surfaces toward the other one of two opposite bonding surfaces, the opposite bonding surfaces being ends of the bonding layer in the thickness direction, and a copper content is increased in the same direction.

2. The semiconductor package according to claim 1, wherein, in each of the first to third bonding layers, the metal content is decreased in the directions from a center region of the bonding layer toward the two bonding surfaces, and the copper content is increased in the directions from the center region of the bonding layer toward the two bonding surfaces.

3. The semiconductor package according to claim 2, wherein the two bonding surfaces of each of the bonding layers constitute a copper layer.

4. The semiconductor package according to claim 3, wherein each of the bonding layers contains at least one of gold (Au) and platinum (Pt).

5. The semiconductor package according to claim 2, wherein each of the bonding layers contains at least one of gold (Au) and platinum (Pt).

6. The semiconductor package according to claim 1, wherein each of the bonding layers contains at least one of gold (Au) and platinum (Pt).

7. The semiconductor package according to claim 1, wherein the substrate is made of copper or a copper alloy, the metal ring is made of an alloy formed by mixing iron (Fe) with nickel (Ni) and cobalt (Co), and the lead is made of an alloy formed by mixing copper or iron (Fe) with nickel (Ni) and cobalt (Co).

8. The semiconductor package according to claim 1, wherein a side surface of the ceramic frame body has an outer shape of a stairs, and the printed wiring is formed to be exposed to a surface of the stairs.

9. The semiconductor package according to claim 1, wherein, in each of the first to third bonding layers, the metal content is decreased in a direction from one of the two opposite bonding surfaces toward the other one of two opposite bonding surfaces direction, and the copper content is increased in the same direction.

10. A semiconductor package comprising:
    a flat substrate having a fixation area where a semiconductor device is fixed on an upper surface;
    a ceramic frame body having a planar shape including upper-layer and lower-layer ceramic frames, a printed wiring being formed on an upper surface of the lower-layer ceramic frame, portions of the upper-layer ceramic frame corresponding to two ends of the printed wiring being narrower than the lower-layer ceramic frame in width so that the both ends of the printed wiring are exposed to be used as terminals, the ceramic frame body surrounding the fixation area and being laminated on an upper surface of the substrate, and a bottom surface of the ceramic frame body being bonded to the upper surface of the substrate through a first bonding layer;
    a metal ring which has a shape corresponding to a shape of the frame in an upper surface of the ceramic frame body and which is laminated on the upper surface of the ceramic frame body being bonded to the ceramic frame body through a second bonding layer; and
    a lead which is laminated on the printed wiring being bonded to the printed wiring through a third bonding layer,
    wherein each of the first bonding layer, the second bonding layer, and the third bonding layer contains copper (Cu) and at least one metal among tin (Sn), indium (In), and zinc (Zn) as a composition and the metal content is decreased in directions from an inner region of the bonding layer toward two bonding surfaces of the bonding layer, and the copper content is increased in the directions from the inner region of the bonding layer toward the two bonding surfaces.

11. The semiconductor package according to claim 10, wherein the two bonding surfaces of each of the bonding layers constitute a copper layer.

12. The semiconductor package according to claim 11, wherein each of the bonding layers contains at least one of gold (Au) and platinum (Pt).

13. The semiconductor package according to claim 10, wherein each of the bonding layers contains at least one of gold (Au) and platinum (Pt).

14. The semiconductor package according to claim 10, wherein the substrate is made of copper or a copper alloy, the metal ring is made of an alloy formed by mixing iron (Fe) with nickel (Ni) and cobalt (Co), and the lead is made of an alloy formed by mixing copper or iron (Fe) with nickel (Ni) and cobalt (Co).

15. The semiconductor package according to claim 10, wherein a side surface of the ceramic frame body has an outer shape of a stairs, and the printed wiring is formed to be exposed to a surface of the stairs.

16. The semiconductor package according to claim 10, wherein the inner region is a center region.

* * * * *